United States Patent
Gipson et al.

(10) Patent No.: US 10,802,198 B1
(45) Date of Patent: Oct. 13, 2020

(54) STRUCTURAL SUPPORT ELEMENTS OF LIGHT GUIDE AND ELECTRICAL HOUSING

(71) Applicant: Dura Operating, LLC, Auburn Hills, MI (US)

(72) Inventors: Ron G. Gipson, Metamora, MI (US); Bhanumurthy Veeragandham, Auburn Hills, MI (US); Indraneel Page, Farmington Hills, MI (US)

(73) Assignee: Dura Operating, LLC, Auburn Hills, MI (US)

( * ) Notice: Subject to any disclaimer, the term of this patent is extended or adjusted under 35 U.S.C. 154(b) by 0 days.

(21) Appl. No.: 16/370,166

(22) Filed: Mar. 29, 2019

(51) Int. Cl.
*F21V 8/00* (2006.01)
*H05K 1/18* (2006.01)

(52) U.S. Cl.
CPC ........... *G02B 6/0045* (2013.01); *G02B 6/005* (2013.01); *G02B 6/0021* (2013.01); *G02B 6/0065* (2013.01); *G02B 6/0083* (2013.01); *H05K 1/181* (2013.01); *H05K 2201/0108* (2013.01); *H05K 2201/10106* (2013.01)

(58) Field of Classification Search
CPC .... G02B 6/0021; G02B 6/0045; G02B 6/005; G02B 6/0065; G02B 6/0081; G02B 6/0083; H05K 1/181; H05K 2201/0108; H05K 2201/10106
See application file for complete search history.

(56) References Cited

U.S. PATENT DOCUMENTS

| | | | | |
|---|---|---|---|---|
| 6,470,594 | B1* | 10/2002 | Boroson | H01L 23/10 257/100 |
| 7,058,250 | B2* | 6/2006 | Bachl | G02B 6/0065 385/15 |
| 7,368,803 | B2* | 5/2008 | Gally | B81B 3/007 257/619 |
| 2005/0202787 | A1* | 9/2005 | Coleman | G06F 1/1662 455/90.3 |
| 2010/0020497 | A1* | 1/2010 | Hayakawa | H05K 3/284 361/705 |

* cited by examiner

*Primary Examiner* — Alan B Cariaso
(74) *Attorney, Agent, or Firm* — Vivacqua Crane, PLLC

(57) ABSTRACT

A component assembly includes a printed circuit board having an electronics component mounted on a first portion of a first face of the printed circuit board. A light emitting diode is mounted on a second portion of the first face. A light guide of a light transmissive polymeric material covers the body including the light emitting diode and the electronics component. The light guide includes: a cavity having the electronics component positioned within the cavity; a non-planar area of the light guide positioned above the cavity, the non-planar area mitigating against collapse of the light guide into the cavity; and a second cavity having the light emitting diode positioned within the second cavity; and a top plate of a polymeric light reflective material mounted onto the light guide directly above the light emitting diode.

14 Claims, 4 Drawing Sheets

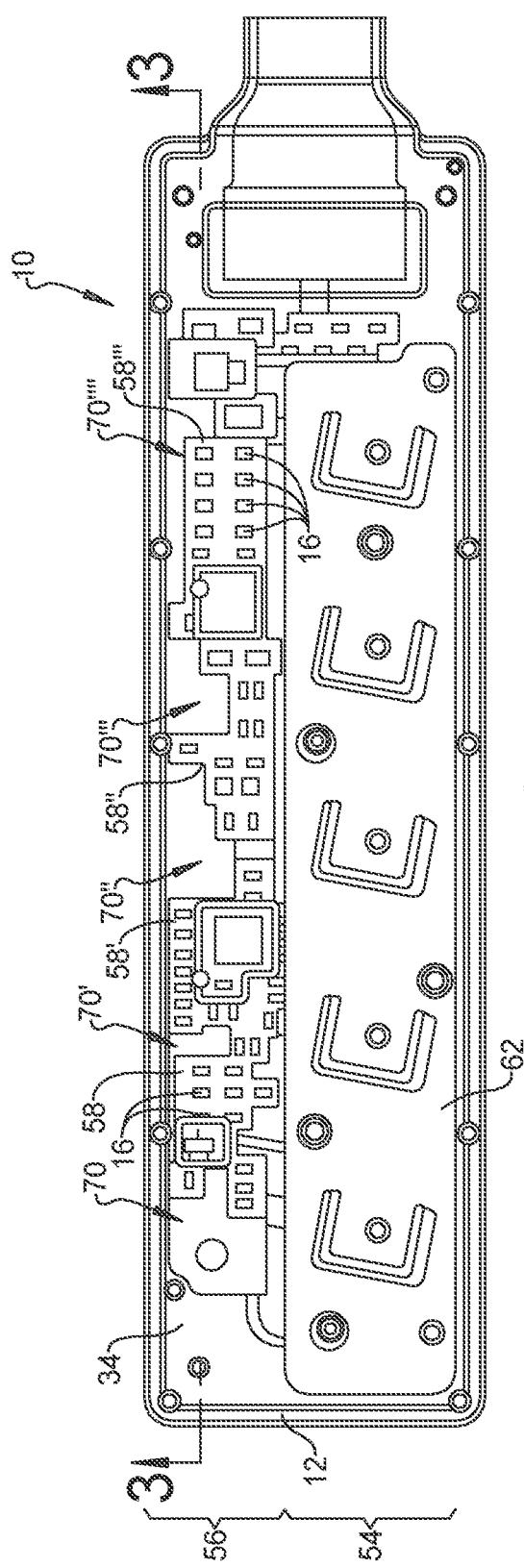
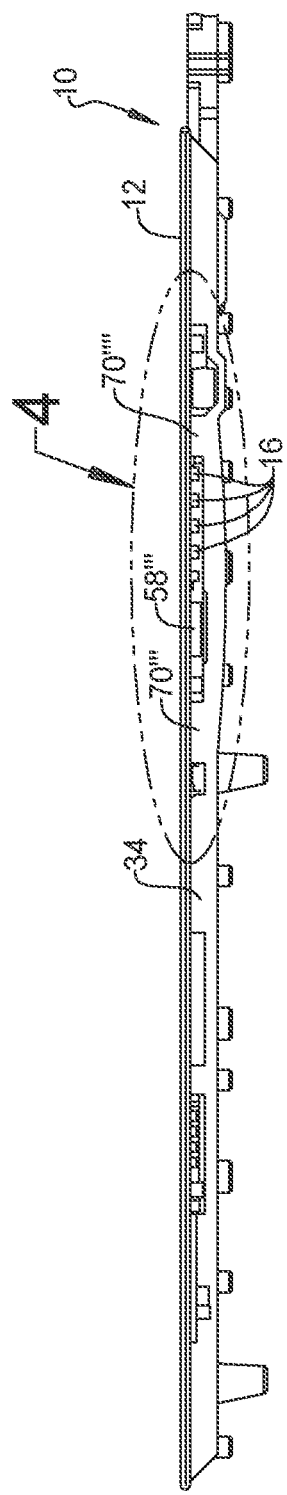
FIG. 2
FIG. 3

FIG. 4

STRUCTURAL SUPPORT ELEMENTS OF LIGHT GUIDE AND ELECTRICAL HOUSING

FIELD

The present disclosure relates generally to printed circuit boards having at least one light generating component and a light guide.

BACKGROUND

The statements in this section merely provide background information related to the present disclosure and may or may not constitute prior art.

Electronic assemblies with backlit visual elements may be manufactured via several processes. Most commonly, a plastic part of a polymeric material resin is molded with some portion of the plastic being clear or translucent, with electronic components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronic components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("packages") onto a polymer film, form the film into a desired shape, and then insert the formed film into an injection mold having the same shape. A following step injection-molds plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Certain open cavities providing space for components that are created during the injection molding operation such as electronics components have a ceiling formed of thin plastic to reduce weight and cost. The ceiling is designed protect the electrical components from mechanical forces that can cause failure to the electrical components or the components' solder points. Loading of the ceiling top plate can occur from hard mechanical forces or pressure such as during the injection molding operation which is detrimental to the components beneath the ceiling top plate.

Thus, while current cavity ceilings of printed film assemblies achieve their intended purpose, there is a need for a new and improved system and method for protecting printed film assemblies.

SUMMARY

According to several aspects, a component assembly includes a body having an electronics component mounted on a first portion of a first face of the body. A light guide covers the electronics component, the light guide having: a cavity having the electronics component positioned within the cavity; and a non-planar area of the light guide positioned above the cavity, the non-planar area providing support for the light guide and mitigating against collapse of the light guide into the cavity.

In another aspect of the present disclosure, the non-planar area includes a ceiling of the cavity positioned directly over the electronics component.

In another aspect of the present disclosure, a clearance gap is provided in an as-molded condition of the non-planar area between the electronics component and the ceiling.

In another aspect of the present disclosure, the non-planar area includes a curved outer surface and wherein the ceiling defines a planar surface.

In another aspect of the present disclosure, the non-planar area includes a curved outer surface and wherein the ceiling defines a curved surface.

In another aspect of the present disclosure, the non-planar area includes a wall having a first thickness defining a first end, a second thickness greater than or equal to the first thickness approximately at a mid-span above the cavity, and a third thickness equal to or less than the second thickness defining a second end.

In another aspect of the present disclosure, the non-planar area includes a dome-shaped wall having an equal thickness throughout the wall.

In another aspect of the present disclosure, the light guide is molded of a light transmissive polymeric material having the non-planar area defining a homogeneous portion of the light guide and includes a support area homogeneously connected to the light guide and extending from the light guide to directly contact the body outside of the cavity to provide support for the top plate and to mitigate against collapse of the cavity.

In another aspect of the present disclosure, a light emitting diode is mounted on the first face of the body; and a top plate molded of a polymeric material is attached to the light guide outside of a portion of the light guide covering the electronic component and also covering the light emitting diode. The top plate is pre-molded and is separately attached to the light guide using multiple pins homogeneously connected to the light guide which are individually received in one of multiple apertures created in the top plate.

In another aspect of the present disclosure, the body defines a printed circuit board and the light emitting diode is mounted on a second portion of the first face separate from the first portion.

In another aspect of the present disclosure, a molded outer layer of an opaque polymeric material is applied to a second face of the body oppositely facing with respect to the top plate.

According to several aspects, a component assembly includes a body having an electronics component mounted on a first portion of a first face of the body. A light emitting diode is mounted on a second portion of the first face. A light guide covers the body including the light emitting diode and the electronics component. The light guide includes a cavity having the electronics component positioned within the cavity. A non-planar area of the light guide has a curved wall positioned above the cavity, the non-planar area mitigating against collapse of the light guide into the cavity.

In another aspect of the present disclosure, the body includes a through aperture positioned proximate to the light emitting diode with the light guide also covering the through aperture.

In another aspect of the present disclosure, the light guide includes a second cavity defining a light outlet positioned over the light emitting diode and aligned with the through aperture positioned proximate to the light emitting diode.

In another aspect of the present disclosure, a top plate of a polymeric light reflective material is mounted onto the light guide directly above the light emitting diode, wherein the top plate is separately attached to the light guide using multiple pins homogeneously connected to the light guide which are individually received in one of multiple apertures created in the top plate.

In another aspect of the present disclosure, the non-planar area includes a curved outer surface and the ceiling defines a planar surface oriented parallel to the body. The non-planar area includes a wall having a first thickness defining a first end, a second thickness greater than or equal to the first thickness approximately at a mid-span above the cavity, and a third thickness equal to or less than the second thickness defining a second end.

In another aspect of the present disclosure, the non-planar area includes a curved outer surface and the ceiling defines a curved surface, and wherein the non-planar area includes a dome-shaped wall having an equal thickness throughout the wall.

According to several aspects, a component assembly includes a printed circuit board having an electronics component mounted on a first portion of a first face of the printed circuit board. A light emitting diode is mounted on a second portion of the first face. A light guide of a light transmissive polymeric material covers the body including the light emitting diode and the electronics component. The light guide includes: a cavity having the electronics component positioned within the cavity; a non-planar area of the light guide positioned above the cavity, the non-planar area mitigating against collapse of the light guide into the cavity; and a second cavity having the light emitting diode positioned within the second cavity. A top plate of a polymeric light reflective material is mounted onto the light guide directly above the light emitting diode.

In another aspect of the present disclosure, the non-planar area of the light guide includes a ceiling positioned over the electronics component, with a clearance gap provided between the electronics component and the ceiling.

In another aspect of the present disclosure, the light guide is attached to the printed circuit board using pins extending from the light guide received in first apertures of the printed circuit board. The top plate is pre-molded and is attached to the light guide using pins homogeneously connected to the light guide which are individually received in second apertures created in the top plate.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 2 is a top plan view of the completed component assembly of FIG. 1;

FIG. 3 is a cross sectional side elevational view taken at section 3 of FIG. 2;

FIG. 4 is a cross sectional side elevational view of area 4 of FIG. 3; and

DETAILED DESCRIPTION

The following description is merely exemplary in nature and is not intended to limit the present disclosure, application, or uses.

Figure 1:
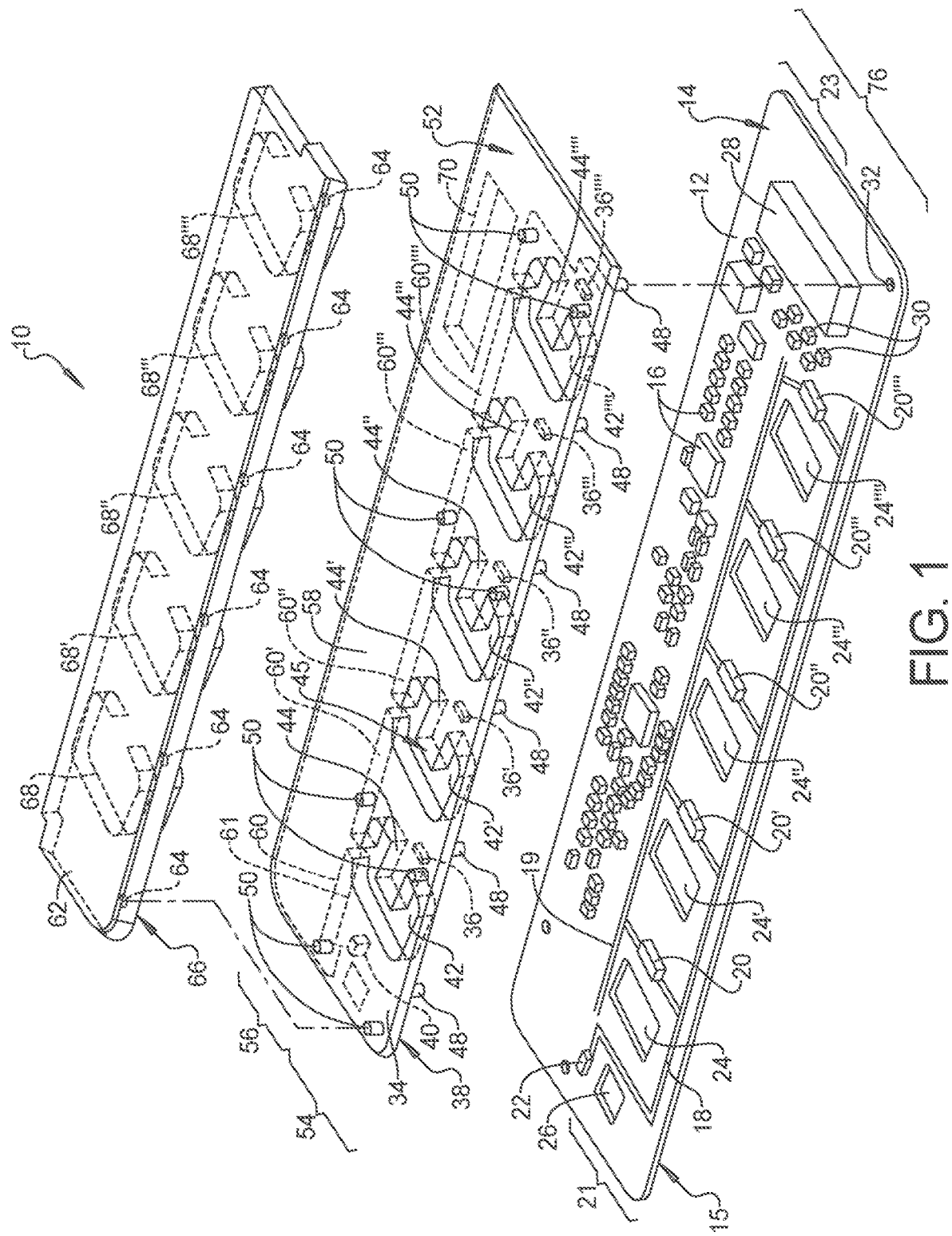
FIG. 1 is a perspective assembly view of a component assembly according to an exemplary aspect.

Referring to FIG. 1, a laminated light guide and component carrier defining a component assembly 10 includes a body 12 such as a printed circuit board having multiple electronics components mounted thereon and which is flexible allowing the body 12 to conform to different shapes including flat and curved. According to several aspects, the body 12 defines a rectangular shape, however any desired geometric shape may be used. The body 12 includes a first side or first face 14 and an oppositely directed second face 15. On the first face 14 of the body 12 are located multiple electronics components 16 including capacitors, which are electrically connected to a plurality of electrical traces 18, 19 (only partially shown for clarity) printed for example by a screen printing process onto the first face 14.

Multiple light emitting diodes 20, 20', 20", 20''', 20'''' are also individually mounted on a first portion 21 of the first face 14 and are connected to the electrical traces 18, 19. An additional light emitting diode 22 can optionally be provided at one end of the first portion 21 of the first face 14 of the body 12 to provide an illuminated indication that electrical power is available for the component assembly 10. According to several aspects, the multiple electronics components 16 are disposed on a second portion 23 of the first face 14 of the body 12. According to several aspects, the light emitting diodes 20, 20', 20", 20''', 20'''' define side firing diodes, with visible light emitted from the light emitting diodes directed generally parallel to the first face 14.

Positioned proximate to each of the light emitting diodes 20, 20' are multiple individual through apertures 24, 24', 24", 24''', 24'''' created in the body 12. According to several aspects each of the through apertures 24, 24', 24", 24''', 24'''' are square or rectangular shaped, however any geometry can be selected. A separate through aperture 26 may also be provided proximate to the light emitting diode 22, which is similar to the through apertures 24, 24', 24", 24''', 24'''' in function, but may have a smaller cross section. Also positioned on the first face 14 of the body 12 is a connector 28 which is connected to the electrical traces 18, 19. Multiple capacitive touch film contacts 30 are provided proximate to a space envelope of the connector 28. Multiple through apertures 32 are provided through the body 12 which frictionally receive pins discussed below.

A light guide 34 is molded from a single injection molding shot of an optically clear polymeric material such as polymethyl methacrylate (PMMA) which is transparent or translucent to allow light passage through the light guide 34. According to several aspects, the light guide 34 is pre-molded and is separately attached to the body 12 defining the printed circuit board as will be described in greater detail in reference to FIG. 2. Multiple light emitting diode receiving pockets 36, 36', 36", 36''', 36'''' are formed in the light guide 34 that open from a contact surface 38 defining a body facing side of the light guide 34. Each of the light emitting diode receiving pockets 36, 36', 36", 36''', 36'''' is sized to receive and partially surround one of the light emitting diodes 20, 20', 20", 20''', 20'''' when the light guide 34 is press-fit onto the first face 14 of the body 12. A separate pocket 40 is also created in the light guide 34 which receives the light emitting diode 22.

Multiple generally U-shaped cavities defining light outlets 42, 42', 42'', 42''', 42'''' are created through the light guide 34 and aligned with individual ones of the through apertures 24, 24', 24'', 24''', 24'''' when the light guide 34 is press-fit onto the first face 14 of the body 12. Multiple light reflectors or light lenses 44, 44', 44'', 44''', 44'''', co-molded of the PMMA material and homogeneously connected to the light guide 34 extend into one of the light outlets 42. Each of the light lenses 44, 44', 44'', 44''', 44'''' includes a planar reflector surface 45 oriented parallel to the contact surface 38. When the light guide 34 is positioned on the body 12 each of the light lenses 44, 44', 44'', 44''', 44'''' overlaps one of the through apertures 24, 24', 24'', 24''', 24'''' with the light guide 34 press-fit onto pins described below extending from the first face 14 of the body 12. A separate light lens 46 also co-molded of the PMMA material and homogeneously connected to the light guide 34 overlaps the through aperture 26 when the light guide 34 is positioned on the body 12.

Multiple male projections defining first pins 48 co-molded of the PMMA material and homogeneously connected to the light guide 34 extend downwardly as viewed in FIG. 1 away from the contact surface 38 of the light guide 34. Each of the first pins 48 is frictionally received in one of the through apertures 32 formed in the body 12 when the light guide 34 is press-fit onto the first face 14 of the body 12. Multiple male projections defining second pins 50 co-molded of the PMMA material and homogeneously connected to the light guide 34 extend upwardly as viewed in FIG. 1 away from a top surface 52 of the light guide 34. The second pins 50 have common lengths and are aligned with apertures created in a top plate 62 which is described in greater detail below.

The light outlets 42, 42', 42'', 42''', 42'''' and the light lenses 44, 44', 44'', 44''', 44'''' are positioned in a first portion 54 of the light guide 34. A second portion 56 of the light guide 34 extends over and therefore covers the remaining portion of the body 12 including over the electronics components 16. One or more partial cavities 58 are formed and extend upward from the contact surface 38 of the second portion 56 of the light guide 34 which individually provide space to receive at least an individual one of the electronics components 16 entirely within one of the partial cavities 58. The second portion 56 also includes one or more wall portions 60, 60', 60'', 60''', 60'''' extending therefrom that at least partially define an edge of the second portion 56. The wall portions 60, 60', 60'', 60''', 60'''' individually or collectively include a distal end 61 that contacts the body 12 and provide structural support for the light guide 34 where the light guide 34 is supported on the first face 14 of the body 12 along the edge of the second portion 56. The partial cavity 58, or cavities if multiple ones of the partial cavities 58 are used, are sized to provide clearance between material of the light guide 34 and the electronics components 16. According to several aspects, the partial cavity 58 is provided as multiple individual partial cavities each including one or more of the electronics components 16. Multiple areas of the light guide 34 within the second portion 56 but positioned outside of the partial cavities 58 are provided as non-planar areas 70, 70', 70'', 70''', 70'''', only one of which is shown in FIG. 1 for clarity. The non-planar areas 70, 70', 70'', 70''', 70'''' are described in greater detail in reference to FIG. 2.

A top plate 62 of a polymeric material such as an injected resin, PMMA material or a stamped film is molded using a molding process. The top plate 62 is sized to fit within a space envelope of the first portion 54 of the light guide 34. The top plate 62 is positioned on and in direct contact with the top surface 52 of the light guide 34 and includes multiple apertures 64 created in a bottom surface 66 which individually receive the second pins 50 of the light guide 34 to mechanically connect the top plate 62 to the light guide 34. The top plate 62 therefore follows a contour or shape of the light guide 34 and the body 12. According to several aspects, the top plate 62 is white in color to reflect visible light created when the light emitting diodes 20, 20', 20'', 20''', 20'''', 22 are energized which would otherwise escape through the light guide 34 and return the light back into the light guide 34.

The top plate 62 also includes multiple male U-shaped filler members 68, 68', 68'', 68''', 68'''' co-molded with and homogeneously extending from the bottom surface 66 of the top plate 62. Each of the filler members 68, 68', 68'', 68''', 68'''' is sized to be slidably received in and to fill one of the cavities defining the light outlets 42, 42', 42'', 42''', 42'''' created in the light guide 34 when the bottom surface 66 is brought into direct contact with the top surface 52 of the light guide 34. The light outlets 42, 42', 42'', 42''', 42'''' created in the light guide 34 receive the filler members 68, 68', 68'', 68''', 68'''' which extend from the top plate 62 to add white reflective material of the top plate 62 directly into the light guide 34.

Referring to FIG. 2 and again to FIG. 1, a fully assembled component assembly 10 is shown having the light guide 34 installed onto the body 12 which covers all of the first face 14 of the body 12 and is positioned above the light emitting diodes 20, 20', 20'', 20''', 20'''', 22, which are not visible in this view, and above the various electronics components 16. The top plate 62 is positioned over the first portion 54 on top of the light guide 34. According to several aspects, the partial cavity 58 of the light guide 34 is provided as multiple individual partial cavities 58, 58', 58'', 58''', individually sized to enclose and cover one or more of the electronics components 16. Multiple areas of the second portion 56 of the light guide 34 which are positioned above the partial cavities 58, 58', 58'', 58''' are designated as the non-planar areas 70, 70', 70'', 70''', 70''''. The non-planar areas 70, 70', 70'', 70''', 70'''' provide additional structural support for the light guide 34 and can withstand the pressure forces induced during a molding operation, and thereby "mitigate" against collapse, meaning the non-planar areas 70, 70', 70'', 70''', 70'''' minimize a potential for collapse of any of the material of the light guide 34 into any of the individual partial cavities 58, 58', 58'', 58''' and onto the electronics components 16 during the molding operation. The non-planar areas 70, 70', 70'', 70''', 70'''' are homogeneously connected to the light guide 34 and are self-supporting. A wall thickness and a predetermined geometry of the non-planar areas 70, 70', 70'', 70''', 70'''' promote their free suspension above the first face 14 of the body 12 and above the electronics components 16 without contacting the electronics components 16. The non-planar areas 70, 70', 70'', 70''', 70'''' are defined as areas of the light guide 34 that may include planar portions and have one or more non-planar portions which may for example include dome-shaped, multi-faceted, oval, semi-circular, or non-continuously curved portions of the light guide 34 with constant or varying wall thicknesses to provide stiffness and structural support within the light guide 34 in addition to the structural support provided by the wall portions 60, 60', 60'', 60''', 60'''' described above in reference to FIG. 1.

Referring to FIG. 3 and again to FIG. 2, an exemplary one of the partial cavities 58, the partial cavity 58''' is created during formation of the light guide 34 to provide an air gap clearance for the electronics components 16 positioned within the partial cavity 58''' and the light guide 34. The non-planar area 70''' of the light guide 34 above the partial cavity 58''' is shown as viewed in FIG. 3.

Referring to FIG. 4 and again to FIGS. 1 through 3, the fully assembled component assembly 10 also includes a molded outer layer 72 of a polymeric material such as acrylonitrile butadiene styrene (ABS) applied to the second face 15 of the body 12 oppositely facing with respect to the light guide 34 and the top plate 62. According to several aspects, the molded outer layer 72 is opaque, and may include sections positioned proximate to the light emitting diodes with designated insignia defining light transmissive portions created in the molded outer layer 72 back-illuminated when any one or all of the light emitting diodes are energized. A final finish layer (not shown) of a polymeric material such as PMMA may also be applied over the molded outer layer 72 to provide a durable finish coat. During a molding operation such as an injection molding operation to inject the material of the molded outer layer 72 a pressure force 74 acts toward the first face 14 and an opposed pressure force 76 acts toward the second face 15 of the body 12. The material of the light guide 34 above the cavities such as the partial cavity 58''' may be prone to partial collapse when these molding pressures are applied and as the parts cool.

To mitigate against cavity ceiling collapse, the non-planar area 70''' positioned above the partial cavity 58''' provides exemplary structural reinforcement for the light guide 34. The non-planar areas 70, 70', 70'', 70''', 70'''' define a homogeneous, or integral extension of the polymeric material of the light guide 34. The non-planar areas 70, 70', 70'', 70''', 70'' " are individually positioned above one of the partial cavities 58, 58', 58'', 58'''.

For example, the non-planar area 70''' defines an upwardly curved (as viewed in FIG. 4), dome-shaped portion of the light guide 34 positioned directly above and thereby bordering the partial cavity 58'''. The non-planar area 70''' wall thickness can vary across a width of the non-planar area 70''' to mitigate against collapse of the partial cavity 58''' during the molding operation. For example, a non-planar wall 78 can include a first thickness 80 defining a first end, a second thickness 82 greater than or equal to the first thickness 80 approximately at a mid-span above the partial cavity 58''', and a third thickness 84 equal to or less than the second thickness 82 defining a second end. According to several aspects the wall thickness continuously varies between the first thickness 80 and the second thickness 82, and between the second thickness 82 and the third thickness 84. According to several aspects the wall thickness is equal and therefore unchanging between the first thickness 80 and the second thickness 82, and between the second thickness 82 and the third thickness 84.

According to several aspects, an outer surface 86 is curved. According to several aspects, a portion such as an interior surface 88 of the non-planar area 70''' is flat and is oriented parallel to the first face 14 of the body 12. At locations where clearance between the electronics components 16 permits, a structural support member 90 can be provided, which defines a homogeneous extension of the material of the light guide 34 which directly contacts the first face 14 of the body 12.

The non-planar areas 70 provide a load path for the pressure force 74 acting toward the first face 14 during the molding operation. The pressure force 74 acting toward the first face 14 is therefore more evenly distributed through the light guide 34, reducing the potential to collapse the inner wall or the interior surface 88 of the light guide 34 above the partial cavity 58''' onto any of the electronics components 16 within the partial cavity 58'''. A clearance gap 92 or air gap is therefore provided between any of the electronic components 16 and the interior surface 88 defining the light guide 34 above any of the partial cavities 58, 58', 58'', 58'''. The clearance gap 92 also provides for clear passage or venting of air or gas outward from between components of the component assembly 10 during assembly as the components and polymeric materials cool from the molding temperatures.

Because some of the electronic components such as an electronic component 94 may be larger or taller than others, a localized ceiling area 96 of the light guide 34 can be modified to accommodate the greater height or space envelope of the electronic component 94. A clearance gap 98 however is still maintained, similar to the clearance gap 92, between the interior surface 88 and the electronic component 94.

Figure 4:
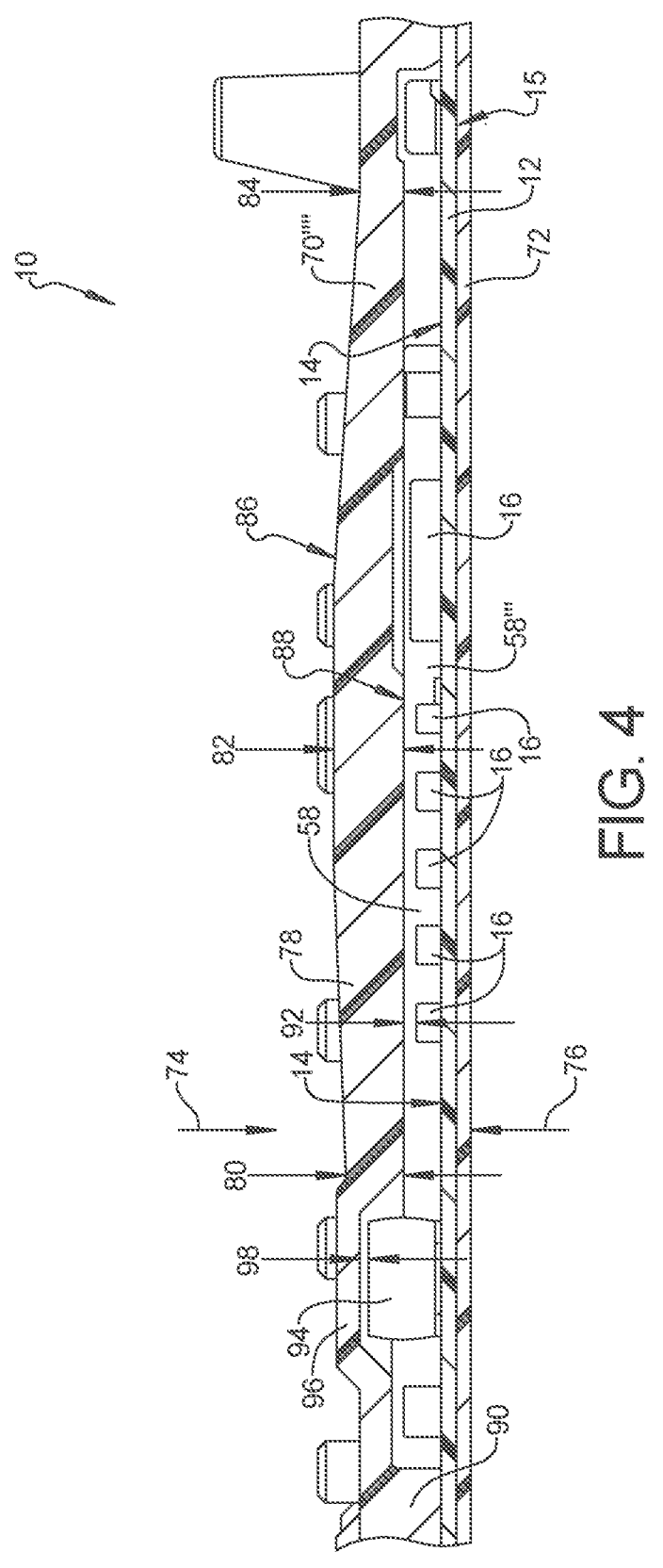

Referring to FIG. 5 and again to FIG. 4, according to further aspects, to mitigate against cavity ceiling collapse, multiple non-planar areas such as a non-planar area 100 are used in place of the non-planar areas 70, 70', 70'', 70''', 70'''' are modified in geometry from the non-planar area 70''' and are similarly individually positioned above partial cavities such as a partial cavity 102 similar to the partial cavity 58'''. The non-planar area 100 provides exemplary structural reinforcement for a light guide 104. The non-planar area 100 defines a homogeneous, or integral extension of the polymeric material of the light guide 104. When multiple non-planar areas 100, 100', 100'', 100''', 100'''' are present (only one of which is shown for clarity) they are individually positioned above one of multiple partial cavities 102, 102', 102'', 102''' (only one of which is shown for clarity). For example, the non-planar area 100 defines an upwardly curved (as viewed in FIG. 5), non-planar portion of the light guide 104 positioned above the partial cavity 102.

The non-planar area 100 wall thickness can remain constant or can vary across a width of the non-planar area 100 to mitigate against collapse of light guide material into the cavity 102 during the molding operation. For example, the non-planar area 100 can include a first thickness 106 defining a first end, a second thickness 108 greater than or equal to the first thickness 106 approximately at a mid-span above the cavity 102, and a third thickness 110 less than or equal to the second thickness 108 defining a second end. According to several aspects the wall thickness remains constant between the first thickness 106 and the second thickness 108, and between the second thickness 108 and the third thickness 110. According to further aspects, the wall thickness continuously varies from the first thickness 106 increasing toward the second thickness 108, and between the second thickness 108 decreasing toward the third thickness 110. According to several aspects, both an outer surface 112 and an interior surface 114 define continuously curving surfaces which can include a fixed radius of curvature or a continuously changing radius of curvature. According to further aspects, the second thickness 108 is less than the first thickness 106 and the third thickness 110. According to several aspects, the outer surface 112 and the interior surface 114 are continuously curved and remain continuously spaced from each other throughout.

A minimum clearance gap 116 or air gap is provided between any of the electronic components 16 and the interior surface 114 defining the light guide 104 above any of the partial cavities. The minimum clearance gap 116 similar to the clearance gap 92 also provides for clear passage or venting of air or gas outward from between components of a component assembly 118 during assembly as the components and polymeric materials cool from the molding temperatures.

As previously noted, because some of the electronic components such as the electronic component 94' may be larger or taller than others, the localized ceiling area 96' of the light guide 104 can be modified to accommodate the greater height or space envelope of the electronic component 94'. The clearance gap 98' similar to the clearance gap 92 is still maintained between the interior surface 114 and the electronic component 94'.

Figure 5:
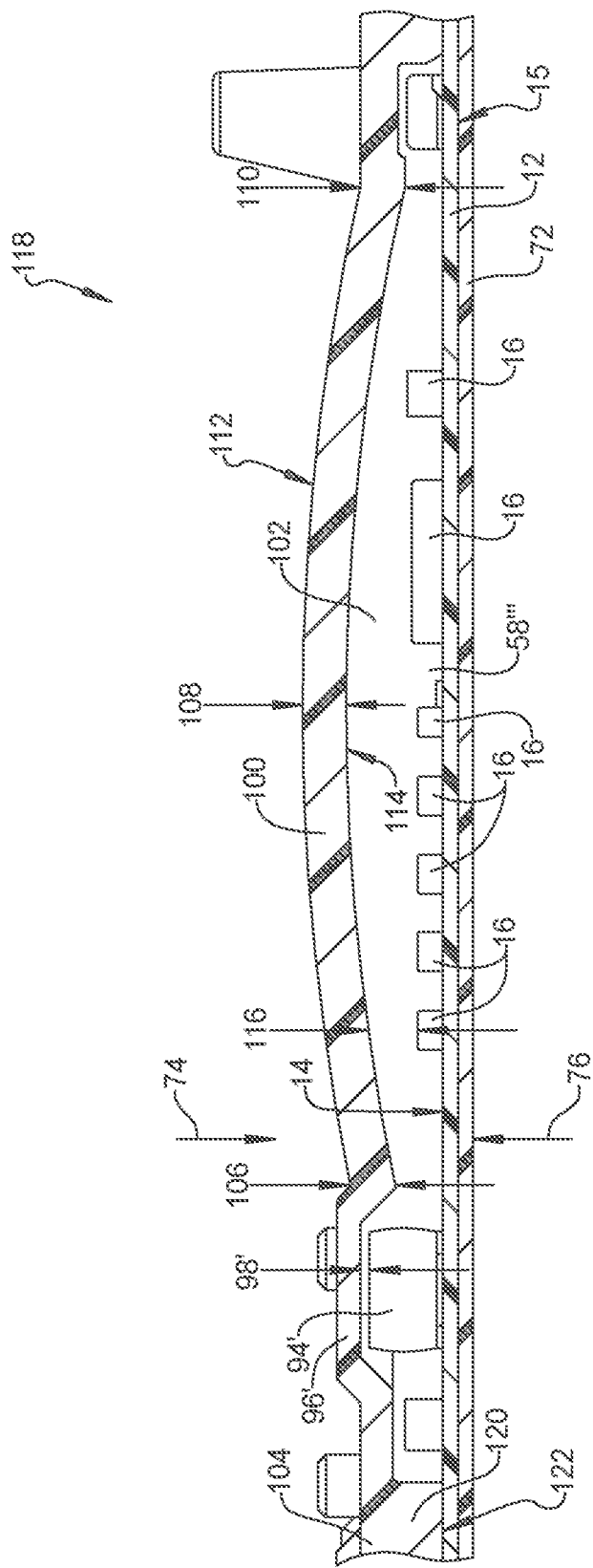
FIG. 5 is a cross sectional side elevational view similar to FIG. 3 of another aspect of a non-planar portion of a light guide.

With continuing reference to FIG. 5, according to other aspects where clearance space between the electronics components 16 permits, the light guide 104 can include one or more support areas such as a support area 120 which include a contact face 122 that directly contacts the first face 14 of the body 12 to provide a direct load support path between the light guide 104 and the body 12. The support areas can have multiple different shapes. These include but are not limited to walls, posts, tab projections and local thickening of the light guide 104. The support areas are homogeneous or integral extensions of the light guide 104.

A component assembly of the present disclosure offers several advantages. These include provision of a light guide 34 and the light guide 104 that include features defined as non-planar portions which cover and protect electronics components 16 within one or more cavities of the light guide 34 or the light guide 104 with the electronics components 16 mounted on a printed circuit board or body 12. The non-planar portions carry loads such as molding pressure loads applied to the light guide 34 or the light guide 104 to the outer extremities of the body 12. The non-planar portions provide structural support for the light guide 34 or the light guide 104 when loading of the light guide 34 or the light guide 104 occurs during molding. The non-planar areas keep the polymeric material ceiling of the cavities from changing position and contacting the electronics components 16. The non-planar areas are formed during the injection molding process and require no further components or labor to achieve protection of the electronics components 16.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A component assembly, comprising:
   a body having an electronics component mounted on a first portion of a first face of the body; and
   a light guide covering the electronics component, the light guide having:
      a cavity having the electronics component positioned within the cavity; and
      a non-planar area of the light guide positioned above the cavity, the non-planar area providing support for the light guide and mitigating against collapse of the light guide into the cavity, wherein the non-planar area includes a ceiling of the cavity positioned directly over the electronics component and wherein the non-planar area defines a dome-shaped wall having an equal thickness throughout the dome-shaped wall.

2. The component assembly of claim 1, wherein a clearance gap is provided in an as-molded condition of the non-planar area between the electronics component and the ceiling.

3. The component assembly of claim 1, wherein the non-planar area includes a curved outer surface and wherein the ceiling defines a curved surface.

4. The component assembly of claim 1, further including:
   a light emitting diode mounted on the first face of the body; and
   a top plate molded of a polymeric material attached to the light guide outside of a portion of the light guide covering the electronic component and also covering the light emitting diode; and
   wherein the top plate is pre-molded and is separately attached to the light guide using multiple pins homogeneously connected to the light guide which are individually received in one of multiple apertures created in the top plate.

5. The component assembly of claim 4, wherein the light guide is molded of a light transmissive polymeric material having the non-planar area defining a homogeneous portion of the light guide and includes a support area homogeneously connected to the light guide and extending from the light guide to directly contact the body outside of the cavity to provide support for the top plate and to mitigate against collapse of the cavity.

6. The component assembly of claim 4, wherein the body defines a printed circuit board and the light emitting diode is mounted on a second portion of the first face separate from the first portion.

7. The component assembly of claim 4, further including a molded outer layer of an opaque polymeric material applied to a second face of the body oppositely facing with respect to the top plate.

8. A component assembly, comprising:
   a body having an electronics component mounted on a first portion of a first face of the body;
   a light emitting diode mounted on a second portion of the first face; and
   a light guide covering the body including the light emitting diode and the electronics component, the light guide having:
      a cavity having the electronics component positioned within the cavity; and
      a non-planar area of the light guide positioned above the cavity, the non-planar area mitigating against collapse of the light guide into the cavity,
   wherein the body includes a through aperture positioned proximate to the light emitting diode with the light guide also covering the through aperture.

9. The component assembly of claim 8, wherein the light guide includes a second cavity defining a light outlet positioned over the light emitting diode and aligned with the through aperture positioned proximate to the light emitting diode.

10. The component assembly of claim 8, further including a top plate of a polymeric light reflective material mounted onto the light guide directly above the light emitting diode, wherein the top plate is separately attached to the light guide using multiple pins homogeneously connected to the light guide which are individually received in one of multiple apertures created in the top plate.

11. The component assembly of claim 8, wherein the non-planar area includes a curved outer surface and a ceiling defining a planar surface oriented parallel to the body, and wherein the non-planar area has a first thickness defining a first end, a second thickness greater than or equal to the first thickness approximately at a mid-span above the cavity, and a third thickness equal to or less than the second thickness defining a second end.

12. The component assembly of claim 8, wherein the non-planar area includes a curved outer surface and a ceiling defining a curved surface, and wherein the non-planar area also defines a dome-shaped wall having an equal thickness throughout the dome-shaped wall.

13. A component assembly, comprising:
- a printed circuit board having an electronics component mounted on a first portion of a first face of the printed circuit board;
- a light emitting diode mounted on a second portion of the first face;
- a light guide of a light transmissive polymeric material covering the printed circuit board including the light emitting diode and the electronics component, the light guide having:
  - a cavity having the electronics component positioned within the cavity;
  - a non-planar area of the light guide positioned above the cavity, the non-planar area mitigating against collapse of the light guide into the cavity; and
  - a second cavity having the light emitting diode positioned within the second cavity; and
- a top plate of a polymeric light reflective material mounted onto the light guide directly above the light emitting diode, wherein the light guide is attached to the printed circuit board using pins extending from the light guide received in first apertures of the printed circuit board, and wherein the top plate is pre-molded and is attached to the light guide using pins homogeneously connected to the light guide which are individually received in second apertures created in the top plate.

14. The component assembly of claim 13, wherein the non-planar area of the light guide includes a ceiling positioned over the electronics component, with a clearance gap provided between the electronics component and the ceiling.

* * * * *